United States Patent [19]
Pricer et al.

[11] Patent Number: 5,160,987
[45] Date of Patent: Nov. 3, 1992

[54] THREE-DIMENSIONAL SEMICONDUCTOR STRUCTURES FORMED FROM PLANAR LAYERS

[75] Inventors: Wilber D. Pricer, Burlington; Thomas B. Faure, Milton, both of Vt.; Bernard S. Meyerson, Yorktown Heights, N.Y.; William J. Nestork, Hinesburg; John R. Turnbull, Jr., Shelburne, both of Vt.

[73] Assignee: International Business Machines Corporation, Armonk, N.Y.

[21] Appl. No.: 656,902

[22] Filed: Feb. 15, 1991

Related U.S. Application Data

[63] Continuation of Ser. No. 427,679, Oct. 26, 1989, abandoned.

[51] Int. Cl.$^5$ .............. H01L 29/78; H01L 23/48; H01L 29/46; H01L 29/34
[52] U.S. Cl. ...................... 257/307; 257/303
[58] Field of Search ............. 357/23.6, 71, 54, 23.7

[56] References Cited

U.S. PATENT DOCUMENTS

| | | | |
|---|---|---|---|
| 4,675,980 | 6/1987 | Lade et al. | 29/571 |
| 4,700,457 | 10/1987 | Matsukawa | 437/52 |
| 4,740,826 | 4/1988 | Chatterjee | 357/42 |
| 4,809,056 | 2/1989 | Shirato et al. | 357/71 |
| 4,845,539 | 7/1989 | Inoue | 357/23.6 |

FOREIGN PATENT DOCUMENTS 0295709 12/1988 European Pat. Off. ........... 357/23.6

OTHER PUBLICATIONS

'Process for Trench Planarization', IBM Tech, vol. 29, No. 3, Aug. 86.

Primary Examiner—Andrew J. James
Assistant Examiner—Stephen D. Meier
Attorney, Agent, or Firm—Howard J. Walter, Jr.

[57] ABSTRACT

Three-dimensional semiconductor structures are taught in which various device types are formed from a plurality of planar layers on a substrate. The major process steps include the formation of a plurality of alternating layers of material, including semiconductor and dielectric materials, forming a vertical access hole in the layers, processing the layers selectively to form active or passive semiconductor devices, and filling the access hole with a conductor. The ultimate structure includes a three-dimensional memory array in which entire dynamic memory cells are fabricated in a stacked vertical orientation above support circuitry formed on a planar surface.

16 Claims, 7 Drawing Sheets

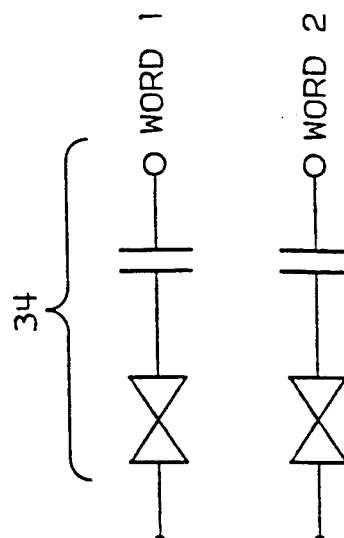
FIG. 3
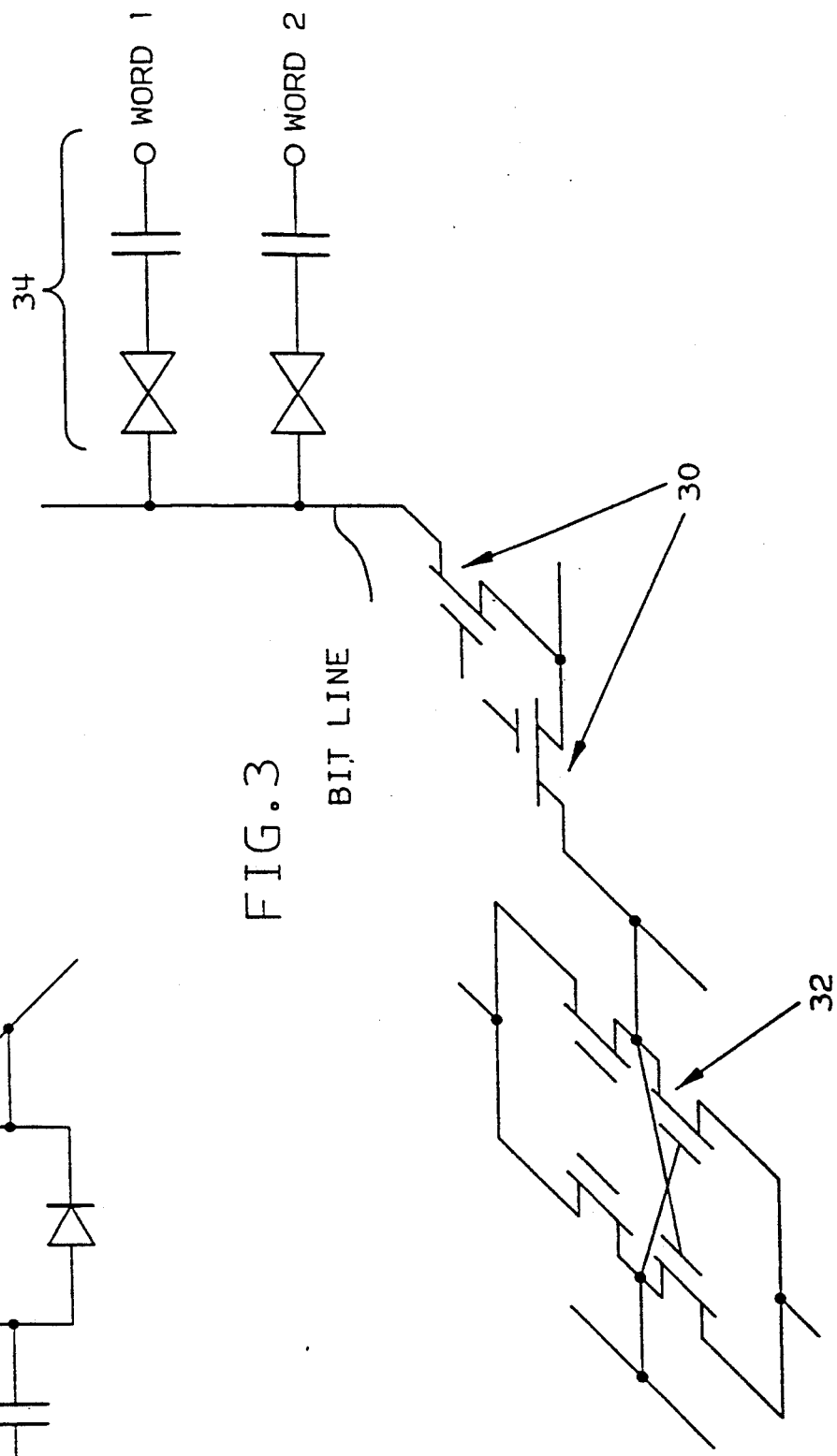
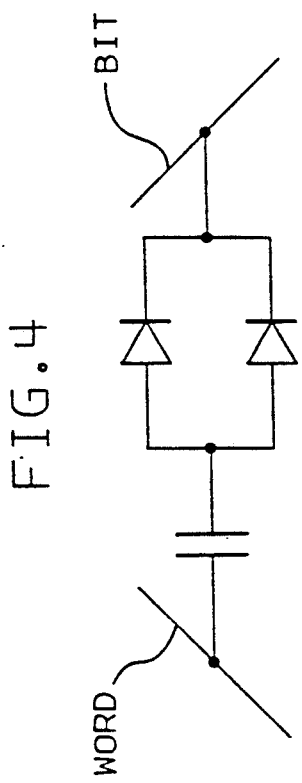
FIG. 4

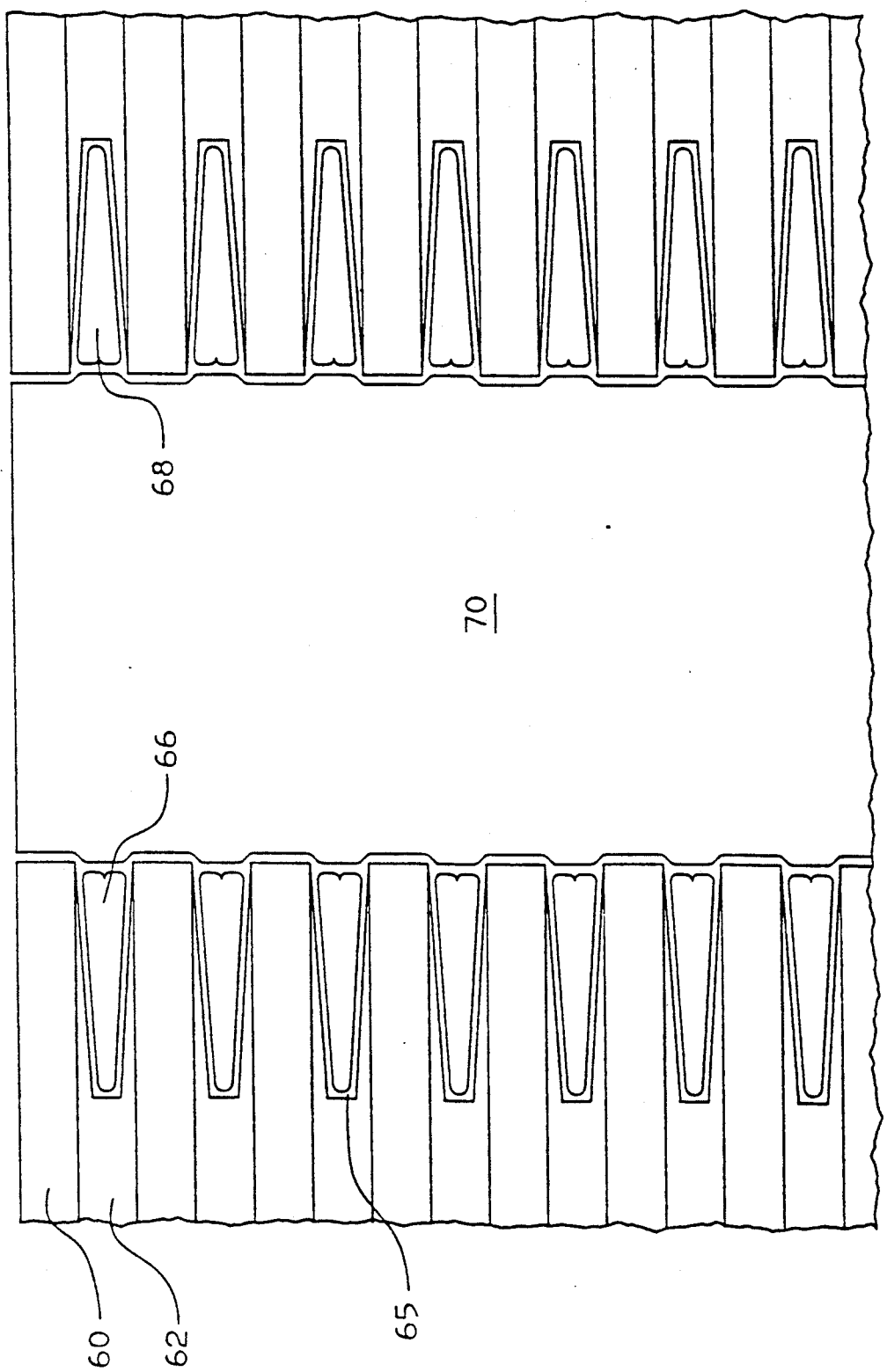

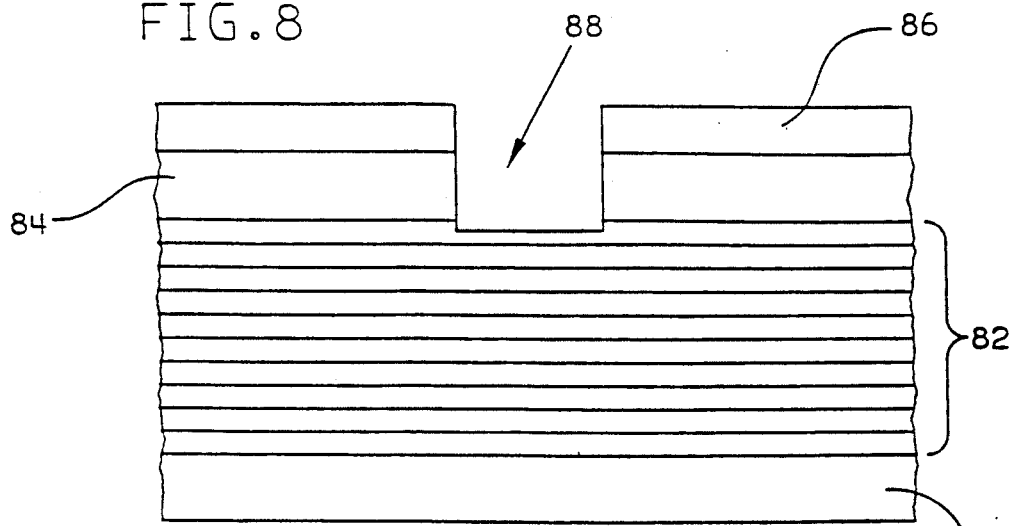
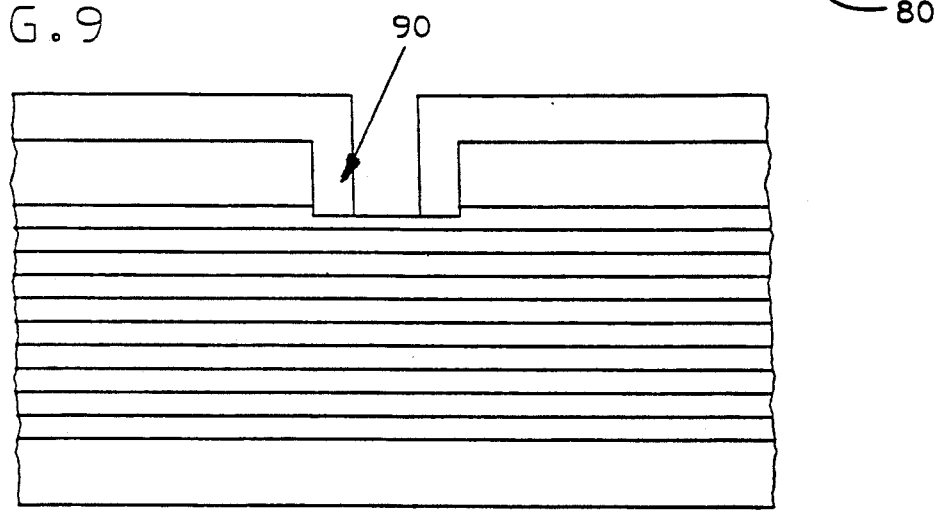
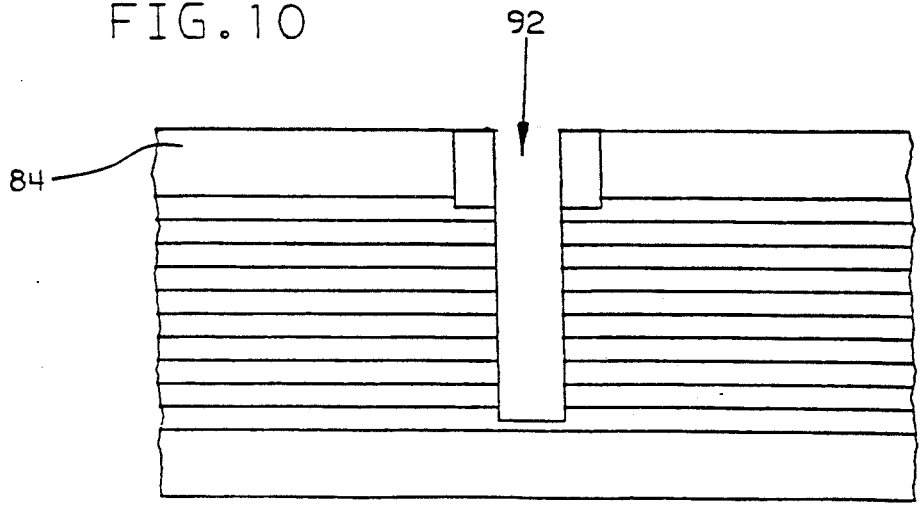

THREE-DIMENSIONAL SEMICONDUCTOR STRUCTURES FORMED FROM PLANAR LAYERS

This is a continuation of copending application Ser. No. 07/427,679 filed on Oct. 26, 1989 now abandoned.

FIELD OF THE INVENTION

This invention relates to semiconductor devices, methods for their fabrication and, more particularly, to three-dimensional semiconductor device structures and methods for providing sub-micron device structures.

BACKGROUND OF THE INVENTION

Description Of The Prior Art

The technology of producing semiconductor devices has been continually pressured to increase effective device densities in order to remain cost competitive. As a result, VLSI and ULSI technologies have entered the sub-micron realm of structural dimension and now are approaching physical limits in the nanometer feature size range. In the foreseeable future absolute atomic physical limits will be reached in the conventional two-dimensional approach to semiconductor device design. Traditionally, Dynamic Random Access Memory (DRAM) designers have faced the severest of challenges in advancing technologies. For example, designers of 64K DRAMs were perplexed to learn that a practical physical limit to charge capacity of storage capacitors had already been reached due to the minimum charge necessary to sense signals in the presence of environmental particulate radiation inherently present in fabrication materials. Storage capacitors in the range of 50 femtofarads are now considered to be a physical limit. From a practical view, this limitation prevented the scaling of DRAM capacitors. Reduction of the surface area of a semiconductor substrate utilized by the storage capacitor has been severely restricted. Due to decreases in the thickness of capacitor materials, existing 1 Megabit (1 Mb) DRAM technologies continue to enjoy the freedom of planar device and circuit design. Beginning with 4 Mb DRAMs the world of three-dimensional design has been explored to the extent that the simple single device/capacitor memory cell has been altered to provide the capacitor in a vertical dimension. In such designs, the capacitor has been formed in a trench in the surface of the semiconductor substrate. In yet denser designs, other forms of capacitor design are proposed, such as stacking the capacitor above the transfer device. Additional designs have been proposed in which the device and its associated capacitor are formed within a trench of preferably minimum dimension.

While such design approaches appear to allow progressive increases in density in the near future, they are constrained by the limit of one memory cell per minimum photolithographic dimension. If semiconductor technology is to be extendable, design and process techniques are required which will enable full three-dimensional circuit design in which structural features are measured in tens of Angstroms and multiple circuit features are provided in the vertical dimension.

The world of three-dimensional semiconductor technology is not without precedent. For example, Kendall et al in U.S. Pat. No. 3,962,713 describes a three-dimensional capacitor structure formed by a series of vertical fins in the surface of a semiconductor substrate. The fins are oxidized and coated with a conductor to form the capacitor. Tigelaar et al in U.S. Pat. No. 4,827,323 describe a stacked capacitor for integrated circuit technology formed of a plurality of alternating conductor and dielectric layers in which alternate conductive layers are interconnected at their edges by a pair of vertical conductors.

Various additional 3-dimensional processing features are also known. For example, U.S. Pat. No. 4,764,801 to McLaughlin et al teaches the use of pillar-shaped vertical epitaxial and polysilicon regions interconnected by a plurality of substantially planar, isolated polysilicon layers to form various device structures. U.S. Pat. No. 4,597,003 to Aine et al is also of interest, as it teaches semiconductor etching techniques for forming thin free-standing layers of n-type silicon on the opposite faces of a semiconductor wafer by the preferential etching of p-type semiconductor material.

Several 3-dimensional semiconductor device structures have been proposed with little or no process or fabrication detail. Both U.S. Pat. No. 4,794,442 to Warner et al. and Published European Application 73,486 of Toyama are examples. The former describes 3-dimensional semiconductor structures formed without metals or insulators through the use of molecular beam deposited epitaxial layers and regions. Device sizes rival conventional planar devices and have dimensions in the 10+ micron range. The latter describes the formation of a multi-level DRAM formed of slabs of semiconductor material including a plurality of memory cells and circuit interconnection means stacked to form a cube-like structure.

Additional three-dimensional semiconductor structures have been described. For example, U.S. Pat. No. 4,675,980 to Lade et al describes a layered device in which layers of insulator and metal are used to form a MOMOM tunnel device U.S. Pat. No. 4,763,179 to Tsubouchi et al describes a DRAM cell in which a buried capacitor is formed by enlarging a trench below the surface of a semiconductor wafer by the selective etching of a dopant introduced into the trench.

SUMMARY OF THE INVENTION

It is an object of this invention to enable the formation of physically delineated three-dimensional technological segments having dimensions of less than 100 nanometers.

It is a further object of this invention to provide semiconductor device structures including a plurality of substantially horizontal trench-like regions connected to a common vertical trench.

It is another object of this invention to provide methods for fabricating physical device structures having dimensions determined by deposition techniques enabling three-dimensional structures in the hundred nanometer range.

It is yet another object of this invention to provide semiconductor structures fully compatible with three-dimensional circuit design.

Accordingly, the invention is directed to laminated semiconductor device structures in which the thickness of the laminated layers is on the order of 10 to 100 nanometers. The various layers forming the laminate are selected so as to exhibit differing selectivity to etchants in order that selected portions can be removed to allow subsequent processing. In the basic processing sequence, a plurality of layers of material is deposited on a substantially planar substrate. A substantially vertical region is formed through a portion of the layers by which various processing steps are facilitated at the exposed edges of the layers. Because of the repetitive nature of the laminated structure, a plurality of substantially identical structures are formed simultaneously in a vertical direction. After appropriate processing, a conductive material may be formed in the vertical region to interconnect the structures formed in the various layers.

Utilization of this technique enables the formation of extremely high density semiconductor structures, such as capacitors and switching devices, useful in forming DRAM cells.

BRIEF DESCRIPTION OF THE DRAWINGS

FIG. 3 is a schematic circuit diagram illustrating a second embodiment of the invention in the form of a DRAM.

FIG. 4 is a circuit diagram of a preferred memory cell for use in implementing the invention.

FIGS. 6 and 7 are sectional views showing partially fabricated stacked memory cells of the circuit of FIG. 3.

FIGS. 8 through 13 are sectional views of another embodiment of the invention illustrating the sequence of steps utilized in fabrication of a DRAM cell.

DETAILED DESCRIPTION OF THE INVENTION

Figure 1:
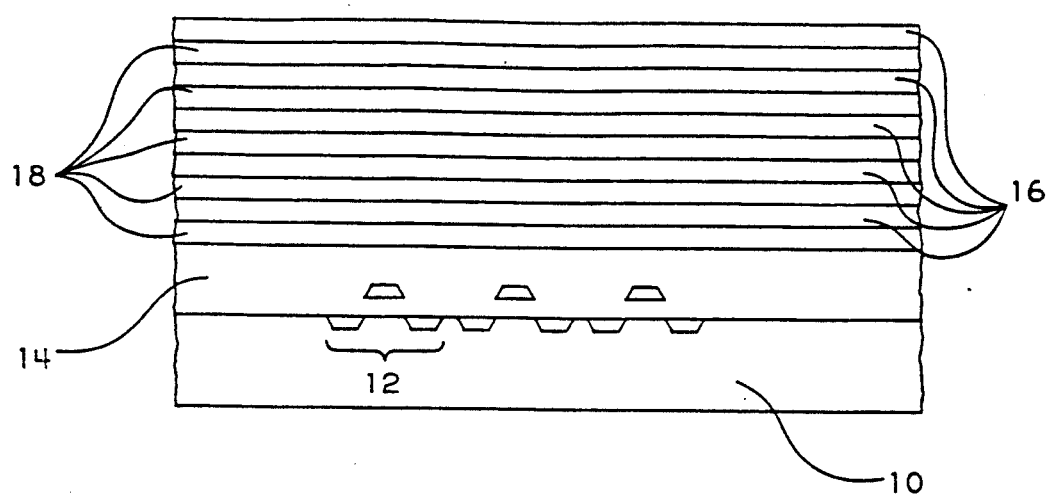
FIG. 1 is a sectional view of one embodiment of the invention showing the location of the planar layers for forming a capacitor above active circuits on a semiconductor wafer.

The first embodiment of the invention relates to on-chip integrated circuit capacitors. Referring to FIG. 1, there is shown a sectional view of a capacitor of the invention. On a semiconductor substrate 10 there are a plurality of FET devices 12 formed by any conventional FET fabrication process. After formation of the basic device structures and their interconnection metallurgy, a planarized layer of insulator 14 is formed by any of a number of deposition and etch-back techniques, such as RIE etching of a polymer layer or the chemical-mechanical polishing of the substrate. Next, a plurality of alternating heavily doped and lightly doped silicon layers 16 and 18 are formed on the substantially planarized surface. The thickness of the polysilicon layers is preferred to be from about 500 to 2500 Angstroms. Impurity concentration of the heavily doped layers is preferred to be about 1.5 E 20 atoms per cubic centimeter, where "E xx" represents 10 to the xx power. Boron is the preferred p-type dopant.

Figure 2:
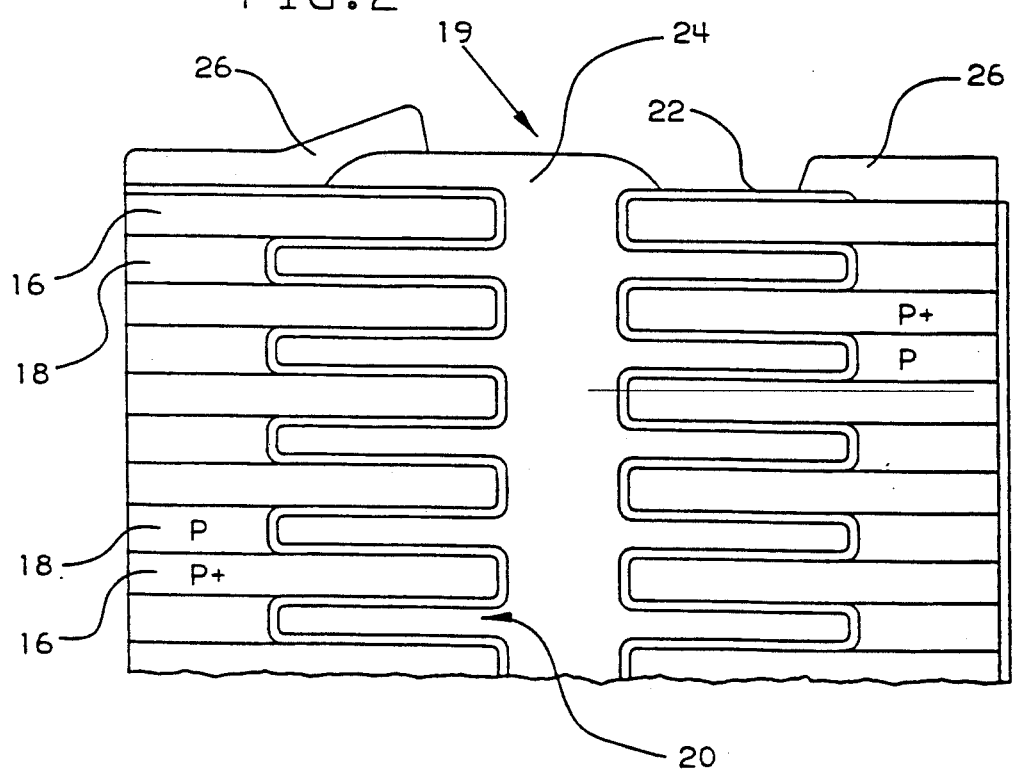
FIG. 2 is an enlarged sectional view of a portion of a capacitor of the invention showing details of fabrication.

Referring to FIG. 2, after the formation of the doped and undoped layers, standard photolithographic process steps are used to form a hexagonal pattern of small vertical trenches 19 completely through the multi-plane laminate. An anisotropic etchant which preferentially reacts with the lightly doped silicon is applied to etch the lightly doped silicon to form a plurality of disk-shaped secondary regions or trenches 20 in the laminate. The preferred etchant is described below at the discussion of the preferred embodiment. The etch ratio between undoped and heavily doped silicon is about 450:1. Next, a blocking mask is applied to establish one or more capacitor islands on the substrate. The edges of these islands are directionally etched down to the top of planarized interlevel dielectric 14. A thin capacitor dielectric layer 22 is formed by chemically depositing a thin oxy-nitride dielectric layer of about 150 A on all surfaces of the exposed polysilicon laminate. Trapped charge in the laminate is removed by annealing at about 800 degrees C. for about 30 minutes. Next, boron doped polysilicon 24 is conformably deposited on all exposed silicon. On the top surface, polysilicon patterns 26 are formed to provide fuses in series with each capacitor. At the surface, the polysilicon fuses are formed such that they have a resistance of about 500 ohms. Upon application of power, should any of the capacitor structures contain a defect which causes a short between conductive layers, the polysilicon fuse will open to isolate the capacitor from the remainder of the circuitry. Each capacitor is designed to have a capacitance of about 740 femto-farads. The time constant of such a capacitor is:

$$500 \times 740 \times E - 15 = 0.37 \; nanosecond.$$

Based on parameters given above, each square millimeter of capacitor structure will provide about 24 nanofarads of capacitance. The semiconductor surface area under the capacitors can be used for various conventional functions as long as no metallurgical contacts are required. Capacitors can be fabricated as individual elements, or as serial or distributed capacitances. The series inductance is in the sub-pico-henry range. Application of such capacitors is foreseen in the areas of power supply filtering and signal processing.

Referring to FIGS. 3-7 there is shown another application of the three-dimensional structure of the invention in which an array of DRAM cells is formed within the interior regions of the horizontal trenches formed in the laminated layers.

Referring briefly to FIG. 3, there is shown a schematic view of the circuitry for the DRAM. In the surface of a semiconductor wafer conventional memory array support circuits including buffering, decoding circuits 30 and sensing circuits 32 are fabricated preferably in CMOS FET technology. These circuits are disposed on the substrate in a generally horizontal plane in the same manner as in contemporary DRAM design. The memory array of the invention is, however, disposed in a substantially vertical direction perpendicular to the support circuits. The dynamic memory cells 34 are preferred to be of the type described in commonly assigned U.S. Pat. No. 3,553,658 issued to W. D. Pricer, herein incorporated by reference. The schematic circuit equivalence of the memory cell is shown in FIG. 4. The cell operates in a manner similar to that of the conventional one-device memory cell.

Fabrication of the three-dimensional storage array begins with the planarization of the semiconductor substrate containing the support circuitry. It is also contemplated that the laminated array structure can be fabricated as a separate item and then coupled to the support bearing substrate by well known bonding techniques. In either case alternating layers of two different materials are deposited preferably by Chemical Vapor Deposition (CVD) with or without plasma excitation. The materials required for this embodiment are a conductor, preferably doped polysilicon, and an insulator, preferably an oxide/nitride combination. In order to accommodate the array of binary addressable memory cells contemplated, the number of conductive layers should be a power of 2. As an example, the number of layers can be 16. The thickness of each layer is a design choice and is on the order of 500 to 5000 Angstroms.

Figure 5:
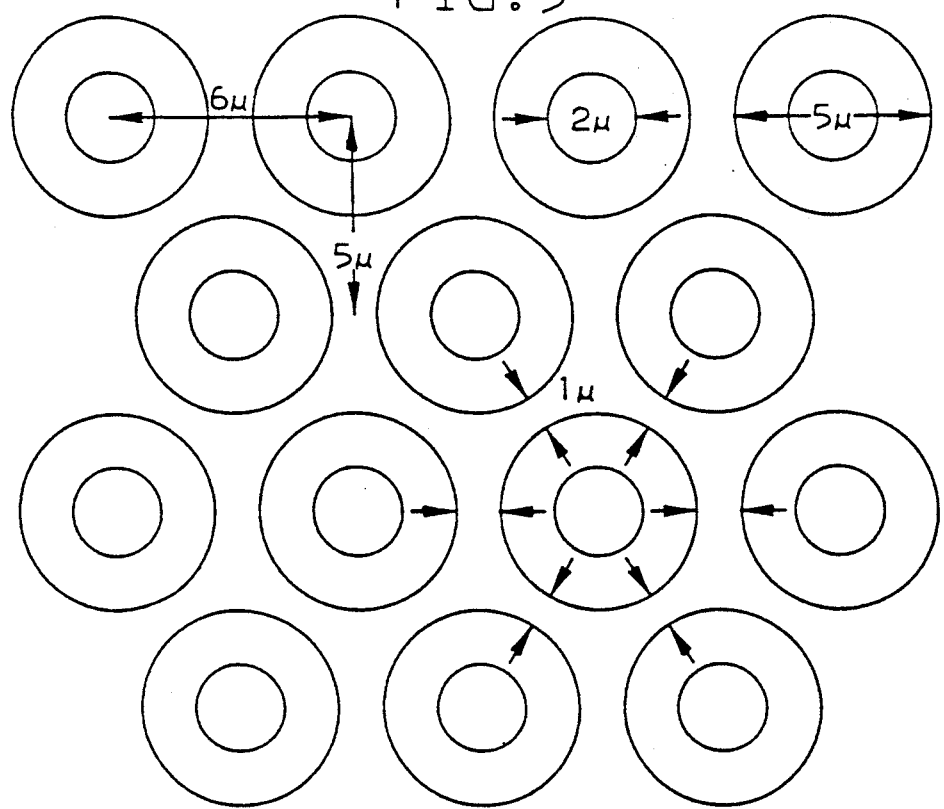
FIG. 5 is a plan view of a pattern of memory cell stacks formed on the top surface of a semiconductor wafer.
Figure 6:
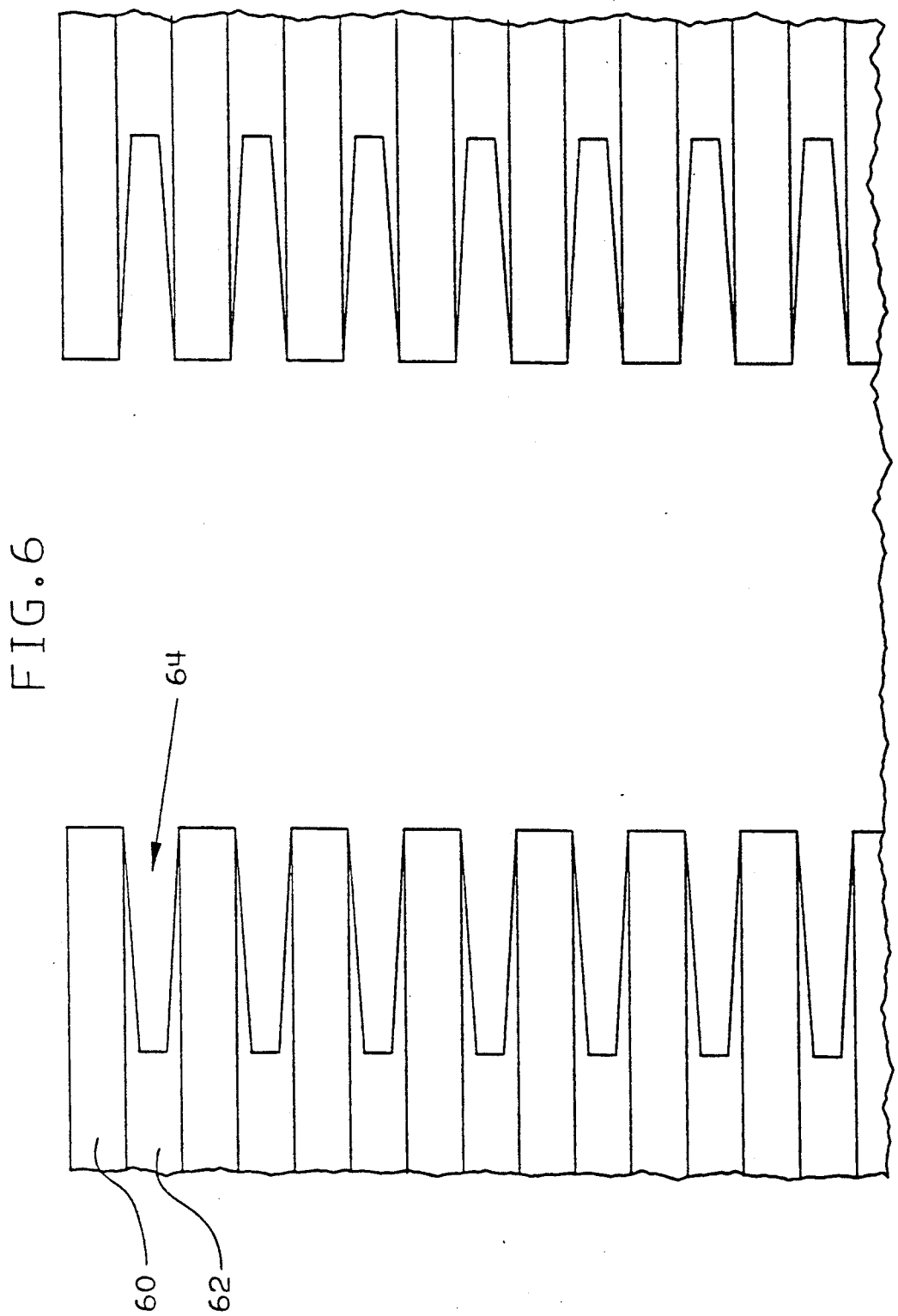

Following deposition of the layers, 16 planes of doped polysilicon and 17 layers of insulator will have been deposited. In order to form the memory cells, a mask is applied to the top surface of the laminate to define within the plane of the array a plurality of vertical regions perpendicular to the plane of the substrate. Apertures in the mask, shown in FIG. 5, are best placed in a hexagonal pattern for maximum density. In this embodiment, cells are spaced at a horizontal pitch of 6 microns and a vertical pitch of 5 microns. The actual mask pattern used is represented by the smaller diameter circles shown and indicated as being of a diameter of 2 microns. Next a highly directional anisotropic etching process is used to produce an array of holes penetrating all of the layers of the laminate. FIG. 6 is illustrative of the cross section of a single hole of the laminate showing only the top region of the of the hole. The specific etching process may vary depending on the exact materials chosen. For example, Reaction Ion Etching (RIE) utilizing silicon tetrafluoride and chlorine as described in U.S. Pat. No. 4,264,409 to Forget et al. It may be desirable to use alternating etching atmospheres to anisotropically etch the alternating layers of oxide 60 and silicon 62.

Following the etching of the vertical holes in the laminate, a selective silicon isotropic etchant such as one containing tetramethylammonium hydroxide, as taught in U.S. Pat. No. 4,113,551 to Bassous et al can be used. The result is to provide a series of horizontal third regions or trenches 64 in the laminate parallel to the surface of the supporting substrate and substantially bounded by oxide layers 60. Next, referring to FIG. 7, the exposed surface of the polysilicon layers is oxidized to form a MOS capacitor dielectric layer having a minimal thickness required for reliable operation. A conformal Chemical Vapor Deposition (CVD) step fills the horizontal trenches with conductive polysilicon 66. A second anisotropic etch is performed to remove silicon from within the vertical portions of the contact holes leaving portions of polysilicon 66 within the horizontal trenches. This is followed by the formation of a region of non-linear barrier layer material 68, such as a pn junction, at the inside ends of each of the polysilicon plugs 66 now filling the horizontal portions of the trenches. The non-linear material acts as the transfer device in the memory cell of previously identified U.S. Pat. No. 3,553,658 to Pricer. Finally, a conductive filler or plug 70 is formed within the vertical trench to interconnect all of the non-linear regions to a common data bus. This completes the array of storage cells. Each cell is coupled to bit line 70 via the non-linear material and the word line conductor 62 via dielectric 65.

Connection to the vertical bit line segments is made directly to the underlying plane containing the support circuits. Connection to the word line segments is somewhat more difficult since the word lines need to be accessed independently. This may be accomplished by utilizing a multilayered terraced arrangement, around the outside of the stacked capacitor arrays. The exposed conductive layers allow access to the individual word lines by conformal layers appropriately personalized along the stair steps of the terraces. Alternately, an access via, formed in a similar manner to the bit line segment trenches, can be used to contact the various word line segments.

Because the capacitance between word lines of the array would be considerable, the exterior portions of the array stacks can be removed leaving the active arrays in the pattern of a waffle grid.

The memory array described here has the potential of providing 16 times the storage density as known DRAM array designs, as the surface area required for each cell in the plane of the substrate is shared by 16 cells in the example given. The three-dimensional array operates by the 2½ D selection scheme analogous to magnetic core technology. In order to render the non-linear material conductive it is necessary to place selection signals on both the word and bit lines.

For purposes of illustration, let it be assumed that the non-linear material operates as a pair of back-to-back diodes with a Vf of 2.5 volts. The following table illustrates the signals required to operate the cell as a single bit storage medium. Entries separated by "," represent two possible signals which are a function of the data being stored or read.

| Condition | Vword | Vstored | Vbit |
| --- | --- | --- | --- |
| Rest | +2.5 | +2.5, 0 | 0 |
| Before Read | | | |
| Selected | +2.5 | +2.5, 0 | +2.5 |
| Unselected | +2.5 | +2.5, 0 | 0 |
| Read | | | |
| Selected | 0 | 0 | +2.5-Signal |
| Unselected | +2.5 | +2.5, 0 | 0 |
| Before Write | | | |
| Selected | +2.5 | +2.5 | +2.5, 0 |
| Unselected | +2.5 | +2.5, 0 | +2.5 |
| Write | | | |
| Selected | +5.0 | +5.0, +2.5 | +2.5, 0 |
| Unselected | +2.5 | +2.5, 0 | +2.5 |

Other drive voltages would be appropriate depending on the I/V characteristics of the non-linear material. In general, the non-linear material must exhibit about five orders of magnitude current change.

Another embodiment of the invention is shown in conjunction with FIGS. 8-13. Disclosed here is a further enhancement of the structures of the invention as embodied in another application to DRAM technology. Here a less aggressive design approach is illustrated in which a single dynamic DRAM cell is fabricated with enhanced capacitance. It has been demonstrated by Meyerson in his published European Patent Application EP 259,759, corresponding to U.S. application Ser. No. 906,854 filed Dec. 9, 1986, now abandoned, that extremely high quality crystalline layers of semiconductor material can be deposited in layers as thin as a few hundred Angstroms by Ultra High Vacuum Chemical Vapor Deposition (UHV/CVD). Referring to FIG. 8 there is shown a cross-section view of a silicon semiconductor substrate comprising a substantially planar supporting substrate region 80 having a surface parallel to a predefined plane. The substrate is heavily doped with boron on which has been epitaxially deposited a plurality of extremely thin layers 82 of alternately heavy and lightly doped, or intrinsic, silicon. The number of layers is not critical as with the second embodiment and can be any convenient number. In order to facilitate the etching in subsequent processing steps, it is preferred that the top thin layer be fabricated as heavily doped. The thickness of each layer is preferred to be in the nanometer range or about 100 to 500 A.

The formation of p/p+ or intrinsic/p+ layers proceeds as follows. Silicon substrates are cleaned in (Huang) acid/hydroxide reagent, etched for 10 seconds in 10:1 Hydrofluoric acid and placed in the UHV/CVD apparatus load lock. After vacuum transfer to within the reactor, the substrates, maintained at about 550 C, are exposed to the flow of reactive gases. For intrinsic silicon, only silane is flowed. For heavily doped layers, silane plus 1% diborane is flowed. At processing temperatures of 450–650 C, growth rate is on the order of 3–30 Angstroms per minute. Reactor pressure during deposition is maintained at approximately 1 millitorr. Resulting layers of silicon have doping of less than 1E17 B/cm(3) and 5E21 B/cm(3) as determined by SIMS analysis.

The topmost layer 84 is substantially thicker than the other layers, as it will be required to support conventional CMOS support circuitry, and should be about 500 to 1500 nanometers in thickness. A layer of thick masking dielectric such as silicon dioxide 86 is deposited and using a photolithographic, or X-ray responsive, masking layer, apertures 88 are formed using a minimum or near minimum geometry in the dielectric layer. Next, a conformal dielectric layer is blanket deposited, partially filling the etched hole in dielectric layer 86. A highly directional RIE etching process is used to remove portions of the conformal layer from the horizontal surfaces only leaving vertical portions 90 of the layer on the sidewalls of the etched apertures. As shown in FIG. 9, sub-lithographic holes remain. Next a silicon selective RIE process is used to form a vertical trench through the thin epitaxial layers. As shown in FIG. 10, the trench 92 can be extended for several microns through the layers.

Figure 11:
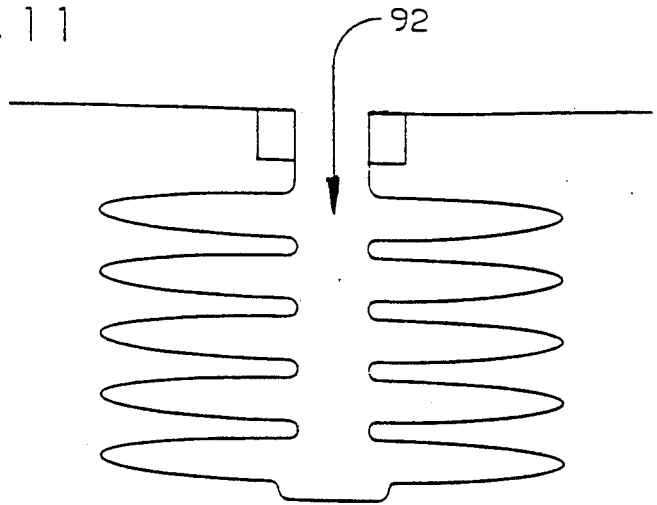

After formation of the vertical trenches, the substrate is subjected to an etchant highly selective to heavily doped silicon, for example an ethylenediamine, pyrocatechol, water solution. This step causes the formation of a plurality of trenches orthogonal to the vertical trench 92, as shown in FIG. 11.

An alternative etchant is Nitric Acid/HF (200:1) at room temperature. This composition is effective for relatively thick (600 A fin, 1300 A space) layers where p+ doping is on the order of 4E21.

Following the formation of the horizontal trenches, a conformal layer of dielectric 94 suitable for the insulator of a storage capacitor is provided on all exposed areas of silicon. Next, a conformal conductive layer 96 is formed over the dielectric layer and may fill the vertical trench. The conductive layer may by doped polysilicon or metal. This completes the formation of the storage capacitor.

Figure 12:
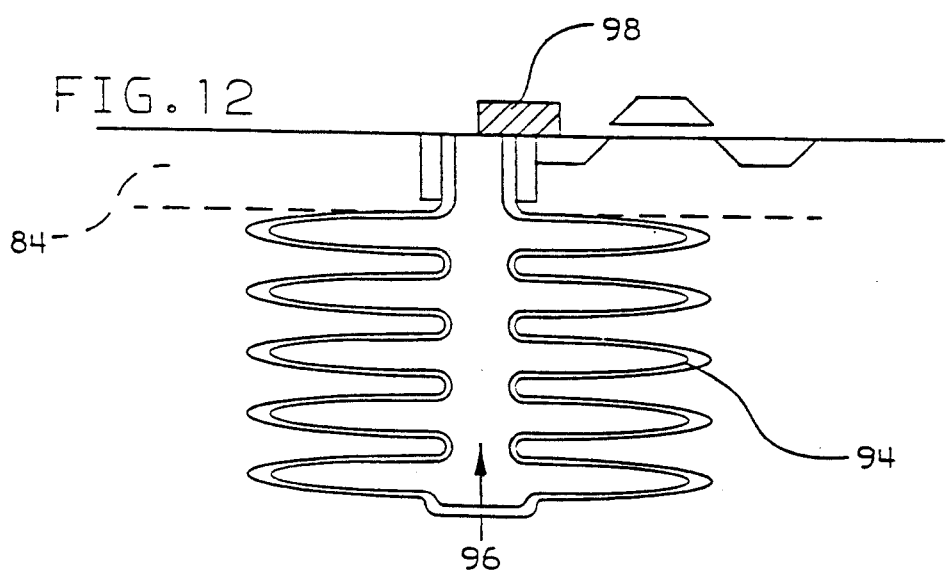

The memory cell is completed by the formation of planar MOS access transistor as shown in FIG. 12. In order to enable the stored data signal to be placed on the capacitor, a surface strap 98 is formed between the storage node and the diffused region of the planar device on the surface of layer 84.

Figure 13:
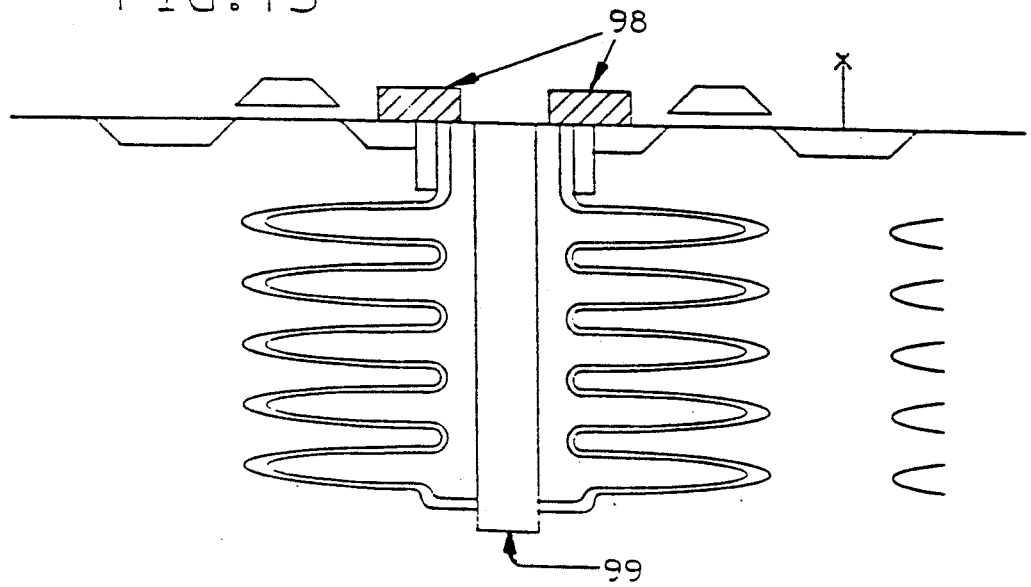

In an alternative embodiment, the storage capacitor of FIG. 12 can be designed to support two capacitors by forming a dielectric filled trench 99 in the center of the cell in a manner similar to the sidewall technique used to form the vertical trench in FIG. 10. A cross-section of such a structure is illustrated in FIG. 13.

In a final embodiment, the etching of the horizontal trenches is facilitated by the use of a highly anisotropic etchant which has the capability of selectively etching along certain crystalline planes.

The use of an anisotropic etchant has the added advantage of providing rectangular etched regions as viewed in the plane of the substrate surface. This enables the design of much more closely packed memory cells across the surface of the substrate.

The preferred anisotropic etchant is described in co-pending application xxx,xxx (BU9-89-006) by Linde et al filed Oct. 3, 1989, now U.S. Pat. No. 4,941,941, and comprises:

| Ethanolamine | 3830 ml |
| --- | --- |
| Gallic Acid | 1150 ml |
| Water | 1200 ml |
| Pyrazine | 25 g |
| Hydrogen Peroxide (30%) | 10 ml |
| FC 129 (1%) | 100 ml |

Etching times between 120 and 600 seconds are recommended depending on the length of horizontal penetration desired. The anisotropic etching was preceded by a 10 second buffered HF dip to remove any "native oxide" which may be present.

In order to obtain maximum packing density, it is necessary to place adjacent 3-dimensional structures as close as possible to each other without causing one structure to interfere with another.

Figure 14:
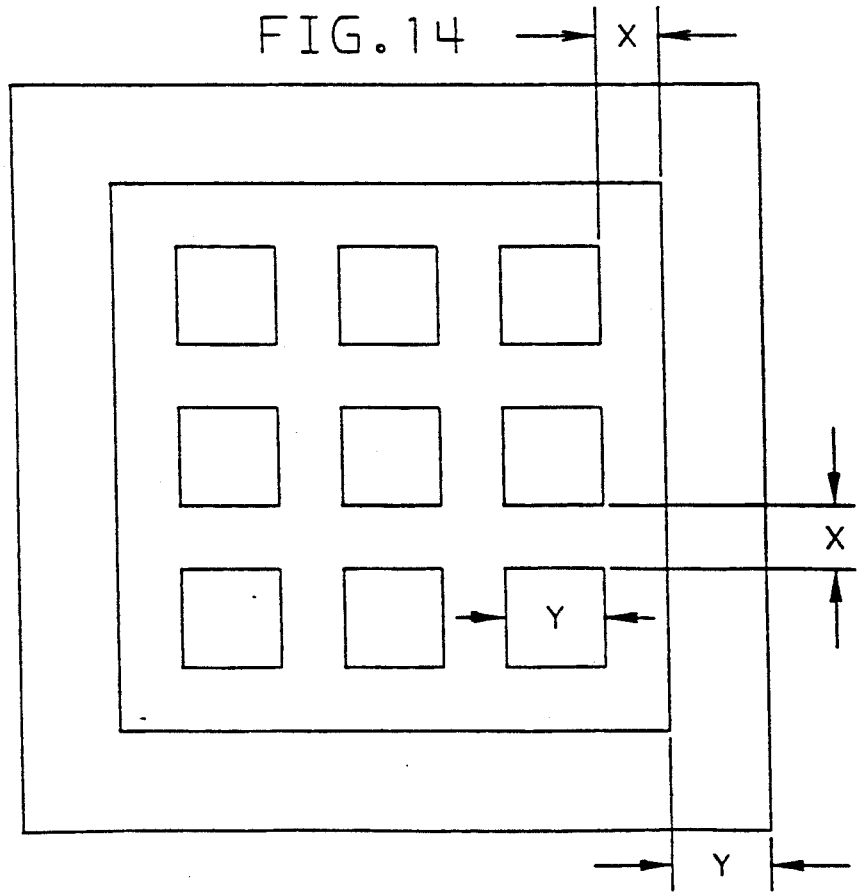
FIG. 14 is a plan view of the mask pattern useful in forming an etch monitor for use in fabricating the memory cells of FIGS. 8-13.

An etch monitor has been developed, as shown in FIG. 14, which enables precise control over the extent of lateral etching of the horizontal trenches. The monitor includes the pattern shown in the figure where the dimension Y equals dimensions used in the array area to define vertical trenches, etc. The dimension X is smaller than the comparable dimension in the non-monitor or array portion of the substrate by about a tenth of a micron in order to place the structures in the monitor closer to each other than their counterparts in the array. During the etching process, when the etchant has etched the horizontal distance X, in the monitor, portions of the monitor will delaminate and float away from the surface of the semiconductor wafer. This condition is easily monitored manually or by the use of an optical apparatus.

While the invention has been described with respect to a limited number of embodiments, it will be understood by those skilled in the art that substitution of materials and other extensions of the invention will be apparent. For example, the formation of different types of active devices and other circuits within the horizontal trenches is clearly anticipated to be within the scope of the invention.

We claim:

1. A semiconductor device comprising:
   a substantially planar substrate including a surface having an orientation parallel to a first plane;
   a plurality of first planar regions of a first material formed in vertical spaced relationship to and above said surface;
   a plurality of second planar regions of conductive material formed above said surface, each second planar region vertically interleaved between adjacent first planar regions;
   a plurality of third planar regions formed laterally adjacent to said second planar regions and vertically between adjacent first planar regions, said third regions being defined substantially by said first material;

a conductive member at least partially filling said third regions, said conductive member being insulatingly spaced from said first and second planar regions; and at least one coupling region, passing through at least some of said first regions, said coupling region including at least one conductor.

2. The semiconductor device of claim 1 wherein the conductor in said coupling region is electrically coupled to at least some of said conductive members in said third regions.

3. The semiconductor device of claim 2 wherein said coupling region is connected to at least one semiconductor switching device formed as a part of a semiconductor memory accessing circuit.

4. The semiconductor device of claim 3 wherein said said switching device is connected to the end of said coupling region farthest from said surface of said substrate.

5. The semiconductor device of claim 4 wherein said coupling region comprises two conductor portions separated by an insulating portion such that at least two memory cells are formed.

6. The semiconductor device of claim 1 wherein the conductor in said coupling region is electrically coupled to the conductive material within the third regions by at least one non-linear barrier layer material.

7. The semiconductor device of claim 1 wherein said third regions exhibit left-right symmetry about an axis orthogonal to said first plane.

8. The semiconductor device of claim 1 wherein said first material comprises semiconductor material.

9. The semiconductor device of claim 8 wherein said semiconductor material comprises silicon.

10. The semiconductor device of claim 9 wherein the thicknesses of said first and second regions are less than 100 nanometers.

11. The semiconductor device of claim 1 wherein said first region comprises heavily doped semiconductor material and said second region comprises substantially intrinsic or lightly doped semiconductor material.

12. The semiconductor device of claim 11 wherein said semiconductor material is crystalline silicon.

13. The semiconductor device of claim 12 wherein said substrate includes a crystalline semiconductor substrate oriented such that said first plane is parallel to the (100) plane of said substrate.

14. The semiconductor device of claim 13 wherein said first and second materials are crystalline semiconductor material epitaxially formed on said substrate and said third regions include boundaries terminating on (111) planes.

15. The semiconductor device of claim 1 wherein the extent of said third regions between said adjacent first planar regions is more than ten times the thickness of said second regions.

16. The semiconductor device of claim 7 wherein said third regions exhibit rotational symmetry about said axis.

* * * * *